United States Patent
Peng et al.

(10) Patent No.: US 10,141,310 B2
(45) Date of Patent: Nov. 27, 2018

(54) SHORT CHANNEL EFFECT SUPPRESSION (71) Applicant: Taiwan Semiconductor Manufacturing Company, Ltd., Hsin-Chu (TW)

(72) Inventors: Cheng-Yi Peng, Taipei (TW); Yu-Lin Yang, Hsinchu County (TW); Chia-Cheng Ho, Hsinchu (TW); Hung-Li Chiang, Taipei (TW); Wei-Jen Lai, Keelung (TW); Tzu-Chiang Chen, Hsinchu (TW); Tsung-Lin Lee, Hsinchu (TW); Chih Chieh Yeh, Taipei (TW); Chih-Sheng Chang, Hsinchu (TW); Yee-Chia Yeo, Albany, CA (US)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 75 days.

(21) Appl. No.: 14/581,905

(22) Filed: Dec. 23, 2014

(65) Prior Publication Data
US 2016/0181244 A1   Jun. 23, 2016

(51) Int. Cl.
*H01L 27/092* (2006.01)
*H01L 29/66* (2006.01)
*H01L 29/161* (2006.01)
*H01L 29/36* (2006.01)
*H01L 29/10* (2006.01)
(Continued)

(52) U.S. Cl.
CPC ........ *H01L 27/0921* (2013.01); *H01L 21/265* (2013.01); *H01L 21/82385* (2013.01); *H01L 21/823456* (2013.01); *H01L 21/823493* (2013.01); *H01L 21/823821* (2013.01); *H01L 21/823892* (2013.01); *H01L 27/0922* (2013.01); *H01L 27/0924* (2013.01); *H01L 29/1033* (2013.01); *H01L 29/1083* (2013.01);
(Continued)

(58) Field of Classification Search
CPC ..... H01L 21/823431; H01L 21/823821; H01L 27/0924; H01L 27/0886; H01L 27/1211; H01L 29/785; H01L 29/0847; H01L 29/0653; H01L 29/78618
See application file for complete search history.

(56) References Cited

U.S. PATENT DOCUMENTS 7,425,740 B2   9/2008   Liu et al.
8,048,723 B2   11/2011   Chang et al.
(Continued)

FOREIGN PATENT DOCUMENTS

JP    2002217416    8/2002

*Primary Examiner* — Michael Lebentritt
*Assistant Examiner* — Suberr Chi
(74) *Attorney, Agent, or Firm* — Haynes and Boone, LLP (57) ABSTRACT

A method of fabricating a semiconductor device includes forming a plurality of isolation features on a semiconductor substrate, thereby defining a first set of semiconductor features, performing an etching process on the first set of semiconductor features such that larger semiconductor features are etched deeper than smaller semiconductor features, after the etching process, forming anti-punch-through features on surfaces of the exposed features of the first set of semiconductor features, forming a semiconductor layer over the anti-punch-through features, and forming transistors on the semiconductor layer of each of the features of the first set of semiconductor features.

20 Claims, 7 Drawing Sheets

(51) Int. Cl.
*H01L 21/265* (2006.01)
*H01L 21/8238* (2006.01)
*H01L 21/8234* (2006.01)

(52) U.S. Cl.
CPC ............ *H01L 29/161* (2013.01); *H01L 29/36* (2013.01); *H01L 29/66795* (2013.01); *H01L 21/823431* (2013.01)

(56) References Cited

U.S. PATENT DOCUMENTS

| | | |
|---|---|---|
| 8,053,299 B2 | 11/2011 | Xu |
| 8,183,627 B2 | 5/2012 | Currie |
| 8,415,718 B2 | 4/2013 | Xu |
| 8,497,171 B1 | 7/2013 | Wu et al. |
| 8,497,177 B1 | 7/2013 | Chang et al. |
| 8,609,518 B2 | 12/2013 | Wann et al. |
| 8,618,556 B2 | 12/2013 | Wu et al. |
| 8,633,516 B1 | 1/2014 | Wu et al. |
| 8,703,565 B2 | 4/2014 | Chang et al. |
| 8,742,509 B2 | 6/2014 | Lee et al. |
| 8,776,734 B1 | 7/2014 | Roy et al. |
| 8,785,285 B2 | 7/2014 | Tsai et al. |
| 8,796,666 B1 | 8/2014 | Huang et al. |
| 8,815,712 B2 | 8/2014 | Wan et al. |
| 2007/0221956 A1 | 9/2007 | Inaba |
| 2013/0285153 A1 | 10/2013 | Lee et al. |
| 2014/0183600 A1 | 7/2014 | Huang et al. |
| 2014/0264590 A1 | 9/2014 | Yu et al. |
| 2014/0264592 A1 | 9/2014 | Oxland et al. |
| 2014/0374840 A1* | 12/2014 | Lee .................. H01L 27/0886 257/401 |
| 2015/0372144 A1* | 12/2015 | Fang ................. H01L 29/7851 257/192 |
| 2016/0049402 A1* | 2/2016 | Liu .................... H01L 27/0924 257/369 |
| 2016/0064288 A1* | 3/2016 | Cheng ................ H01L 29/165 257/192 |
| 2017/0170278 A1* | 6/2017 | Peng .................. H01L 29/1083 |

* cited by examiner

SHORT CHANNEL EFFECT SUPPRESSION

BACKGROUND

Fabrication of integrated circuits involves forming large numbers of very small devices on a single wafer. As fabrication technologies improve, the devices become smaller such that more devices can fit within a smaller amount of space. A commonly formed device is a transistor. A transistor generally includes a gate terminal, a source terminal, and a drain terminal. A channel is positioned below the gate and between the source and drain terminals. Based on the signal applied to the gate, electric current is allowed or prevented from flowing through the channel.

As transistors are formed with smaller sizes, the channels of such devices also become smaller. Smaller channels may present a variety of issues, which are often referred to as the short channel effect. For example, a short channel may allow for current to inadvertently flow between the source and drain based on voltage differential between the source and drain. To avoid this issue, anti-punch-through features can be formed at or near the bottom of a channel. It is desirable to form such anti-punch-through channels in a manner that maximizes their efficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As described above, anti-punch-through features can be formed at or near the bottom of a channel to help reduce the short channel effects. It is desirable to form such anti-punch-through features in a manner that maximizes their efficiency. Particularly, different transistors within the same circuit often have different sizes. P-type transistors can particularly benefit from methods and structures that increase the efficiency of operation.

According to principles described herein, the anti-punch-through features of the p-type transistors can be formed at varying depths, the varying depths being based on the size of each respective transistor. In one example, this may be done by forming the anti-punch-through features of the p-type transistors before forming the channel. The following provides a detailed discussion of devices with anti-punch-through features with varying depths, as well as methods of fabricating such devices.

Figure 1A:
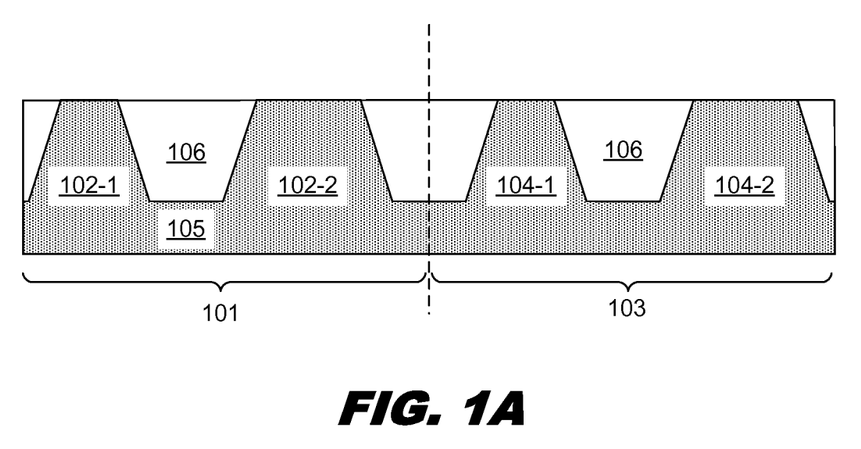
FIGS. 1A-1G are diagrams showing an illustrative process for forming devices with anti-punch-through features at varying depths, according to one example of principles described herein.

FIGS. 1A-1G are diagrams showing an illustrative process for forming devices with anti-punch-through features at varying depths. FIG. 1A illustrates the formation of several semiconductor features 102, 104 formed around isolation structures 106. Specifically, in an n-type region 101, a first set of semiconductor features 102 is formed. The semiconductor features of the first set will ultimately be used for n-type transistors. In a p-type region 103, a second set of semiconductor features 104 is formed. The semiconductor features of the second set will ultimately be used for p-type transistors.

In one example, the semiconductor features 102, 104 are formed by creating isolation structures 106 around the features. An isolation structure 106 may be, for example, a Shallow Trench Isolation (STI) structure. Such structures are created by etching trenches within a semiconductor substrate 105. Then, the trenches can be filled with an isolation material, such as a dielectric material. Then, a planarizing process such as a Chemical Mechanical Polishing (CMP) process is performed to create a flat surface and remove any excess material.

The semiconductor features 102 within the n-type region 101 may be referred to as n-type features because the semiconductor material therein is doped appropriately to form an n-type transistor. Specifically, the semiconductor material is doped with a p-type dopant such as boron. Similarly, the semiconductor features 104 within the p-type region 103 may be referred to as p-type features because they will ultimately be doped appropriately to form a p-type transistor. Specifically, they will be doped with an n-type dopant such as phosphorous.

In various semiconductor devices, different transistors may have different sizes. According to the present example, a first n-type feature 102-1 within the n-type region 101 is smaller than a second n-type feature 102-2 in the n-type region 101. Likewise, a first p-type feature 104-1 within the n-type region 103 is smaller than a second p-type feature 104-2 in the n-type region 103.

Figure 1B:
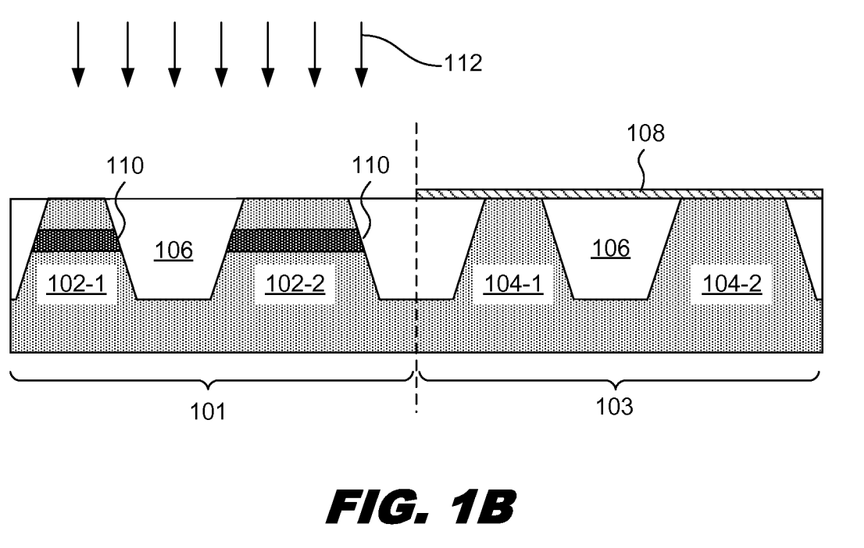

FIG. 1B is a diagram showing formation of anti-punch-through features 110 in the n-type region 101. According to the present example, before applying fabrication processes to the n-type region, the p-type region is covered with a mask layer 108. The mask layer may be, for example, an oxide layer. Other materials may be used as well, including silicon nitride, silicon oxynitride, a combination thereof, or any other suitable dielectric material. The mask layer 108 may be applied evenly across the wafer. Then, using various photolithographic techniques, the mask layer 108 over the n-type region 101 is removed, while leaving the mask layer 108 over the p-type region 103 substantially intact. For example, a photoresist layer may be deposited over the mask. Then, the photoresist layer may be exposed to a light source through use of a patterned photomask. The patterned photomask is such that the desired pattern is applied to the photoresist layer such that portions intended to be removed are dissolvable to a developing solution. Then, an etching process can be used to remove the exposed portions of the mask layer 108.

After the mask layer 108 is patterned to expose the n-type region, an implanting process 112 can be used to form anti-punch-through features 110 in the n-type region. The implanting process 112 can be tuned such that the anti-punch-through features 110 are formed at a particular depth below the surface of the n-type features 102-1. In one example, the anti-punch-through features 110 are formed at a depth such that a bottom of the anti-punch-through features 110 are within a range of about 30-50 nanometers below the surface. This can be done by adjusting the electric field used in the ion implanting process. Ion implantation utilizes an electric field to accelerate ions towards a surface. By setting the strength of the electric field appropriately, the ions can lodge near a specific point below the surface. The approximate thickness of the anti-punch-through features 110 may be within a range of about 5-10 nanometers. The implanting process 112 implants a p-type dopant, such as boron, but at a higher concentration than the rest of the features 102, which are already doped with a p-type dopant. In one example, the concentration of the p-type dopant for the anti-punch-through feature is within a range of about $1\times10^{17}/cm^3$-$1\times10^{18}/cm^3$. The dopant concentration of the channel region above the anti-punch-through features may be within a range of about $1\times10^{15}/cm^3$-$1\times10^{16}/cm^3$. The implanting process 112 is such that each of the anti-punch-through features 110 is at a substantially similar depth. This is so despite the variation in size between the various features 102. In some examples, a Rapid Thermal Annealing (RTA) process is performed after the implanting process 112. An RTA process involves exposing the substrate to high temperatures.

Figure 1C:
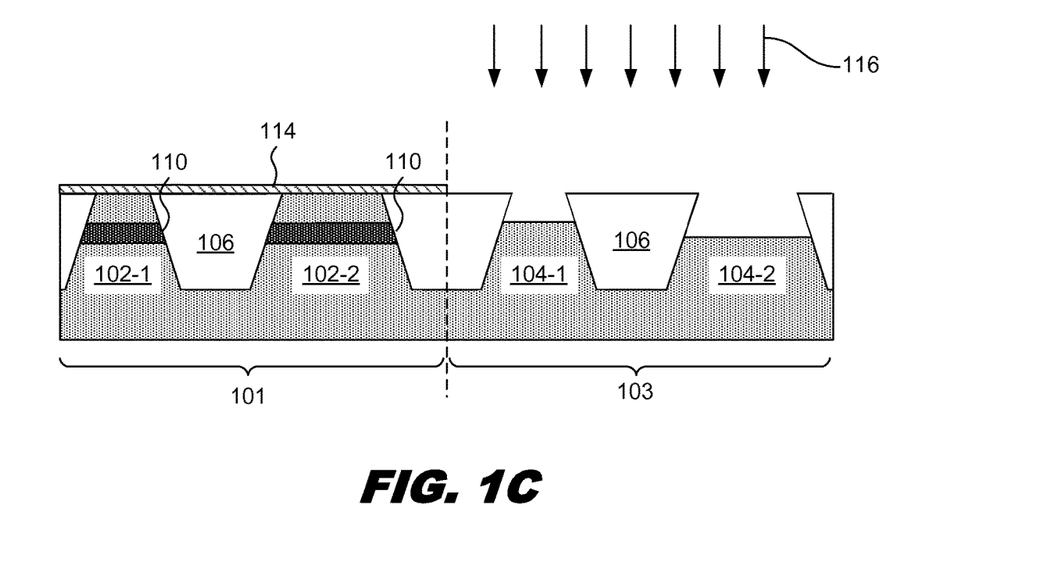

FIG. 1C is a diagram showing an illustrative etching process 116 performed on the p-type region 103. According to the present example, the mask layer 108 is removed and a second mask layer 114 is applied. The second mask layer 114 is then patterned such that it covers the n-type region 101 and exposes the p-type region 103. The mask layer 114 may also be made of an oxide material or other material as described above regarding mask 108, and may be patterned using various photolithographic techniques.

The etching process 116 is designed to remove exposed semiconductor material while leaving the isolation structures 106 substantially intact. The etching process may be, for example, a dry etching process. Due to the loading effect, the features 104 that are larger will be etched more quickly than the smaller features 104. Specifically, because the second p-type feature 104-2 is larger than the first p-type feature 104-1, the second p-type feature 104-2 will be etched deeper than the first p-type feature 104-1.

Figure 1D:
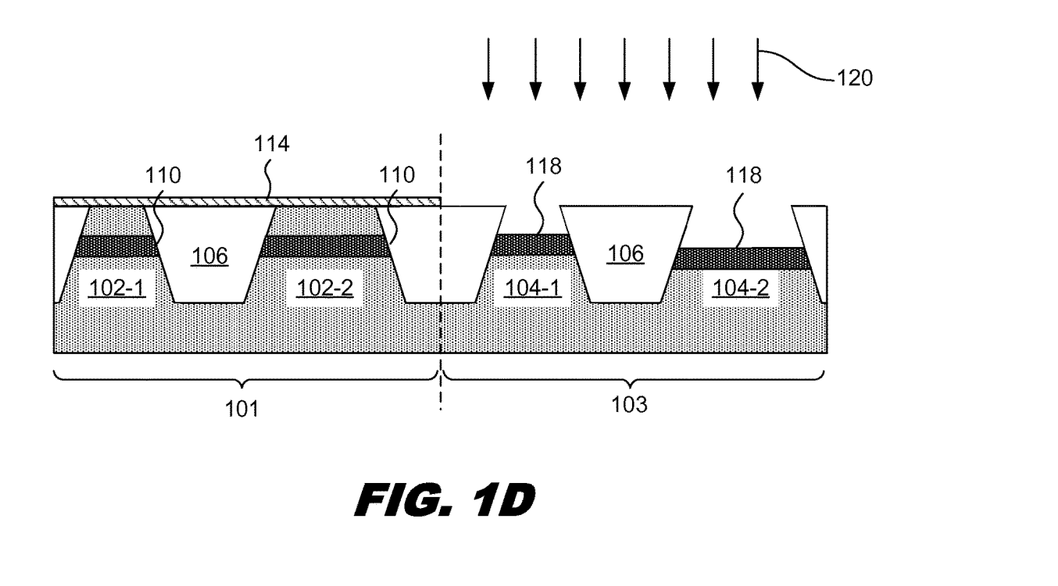

FIG. 1D is a diagram showing an illustrative formation process 120 to form the anti-punch-through features 118 for the p-type region 103. In one example, the formation process is an implanting process. The implanting process occurs after the etching process 116 described in the text accompanying FIG. 1C. The implanting process 120 uses an n-type dopant, such as phosphorous, arsenic, or antimony, to create a higher doping concentration than that of the channel material, the formation of which will be described below. The implanting process 120 is tuned, for example by adjusting bias power, such that the anti-punch-through features 118 are formed on the surface of the features 104. Other methods of forming the anti-punch-through features 118 may be used as well. For example, a diffusion process using either a gas source or solid source may be used. In one example, the anti-punch-through features 118 may be formed through an epitaxial growth process with in-situ doping. Because the surfaces of the features 104 are at varying levels, the anti-punch-through features 118 are also formed at different levels. Specifically, larger features will have deeper anti-punch-through features 118. Conversely, smaller features will have shallower anti-punch-through features 118.

The anti-punch-through features 118 may be formed to have a thickness within a range of about 5-10 nanometers extending from the surface of the features 104. In one example, the concentration of the n-type dopant for the anti-punch-through features 118 is within a range of about $1\times10^{17}/cm^3$-$1\times10^{18}/cm^3$. The dopant concentration is greater than that of the channel material that will be formed as described below. After the anti-punch-through features have been formed, an annealing process such as an RTA process may be performed.

Figure 1E:
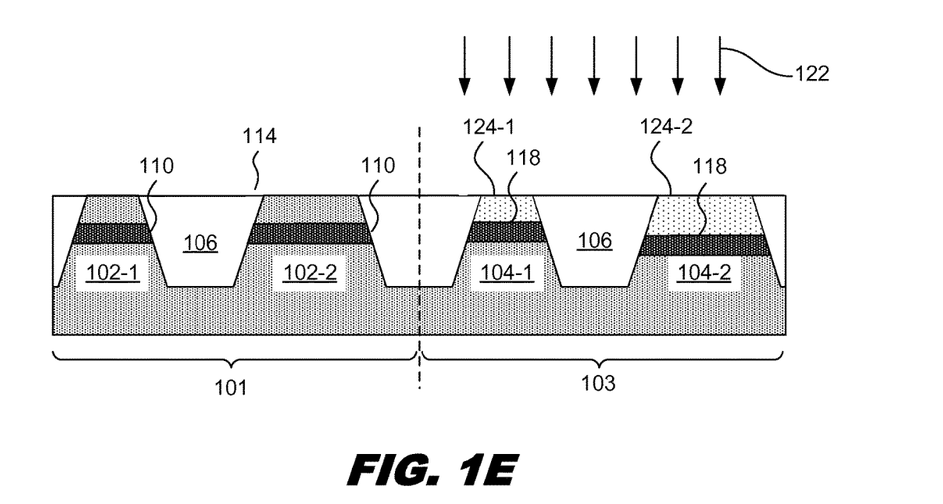

FIG. 1E is a diagram showing formation of a semiconductor layer 124 on top of the anti-punch-through features 118. The semiconductor layer 124 may be a semiconductor material that is designed for use as a channel material for a p-type device. Thus, the semiconductor layer is doped with an n-type dopant. The doping concentration may be within a range of about $1\times10^{15}/cm^3$-$1\times10^{16}/cm^3$. In one example, the semiconductor layer 124 may be formed using an epitaxial growth process. The semiconductor layer 124 may also be doped in-situ. In one example, the semiconductor layer 134 may be silicon germanium, or another germanium based semiconductor layer. The ratio of silicon to germanium may be within a range of 1:0.1-0.9. Because the first feature 104-1 has a smaller width than the second feature 104-2, the semiconductor layer 124-1 formed on the first p-type feature 104-1 also has a smaller width than the semiconductor layer 124-2 formed on the second p-type feature 104-2. After the semiconductor layer 124 is formed, the mask layer 114 covering the n-type region may be removed. Additionally, a CMP process may be performed to planarize the surface of the wafer.

Figure 1F:
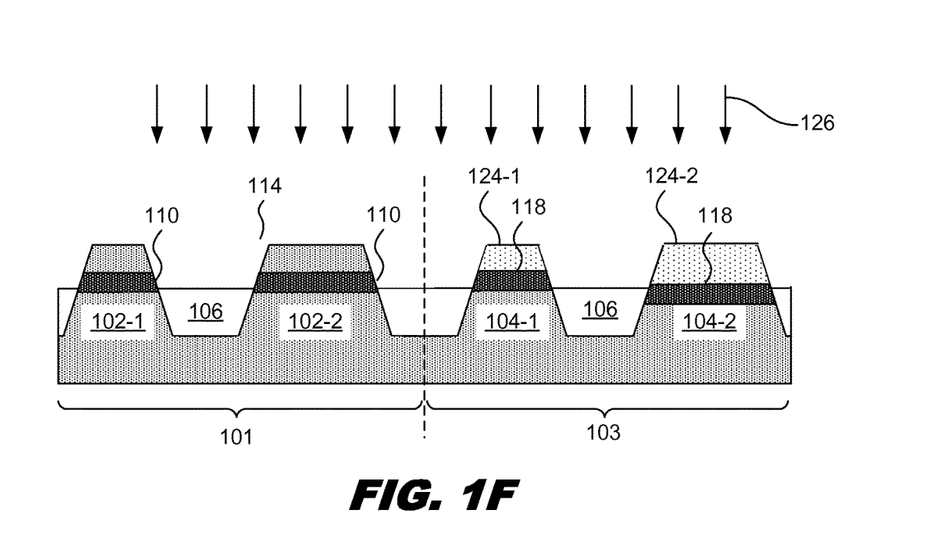

FIG. 1F is a diagram showing an illustrative finFET (fin Field Effect Transistor) formation process. This is done by performing an etching process 126 to remove portions of the isolation structures 106. The etching process 126 is selective such that the material forming the isolation structures is removed while the remaining features 102, 104 are left substantially intact. The result is that the features 102, 104 now protrude from the surface of the isolation structures to form fin-like shapes. Such fin-like shapes can provide a number of benefits to transistors.

Figure 1G:
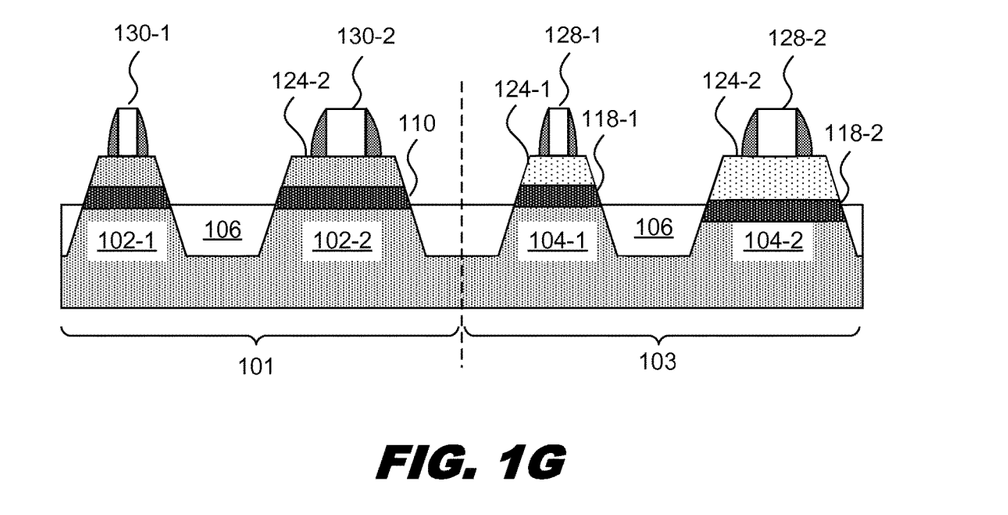

FIG. 1G is a diagram showing formation of gates 128, 130 on the features 102, 104. In one example, the gates 128, 130 run perpendicular to the underlying fin-like structures. The gates may also vary in size based on the size of the feature 102, 104 on which they are formed. For example, in the n-type region, the second gate 130-2 is wider than the first gate 130-1 as the second gate 130-2 is formed on a larger feature. Likewise, in the p-type region, the second gate 128-2 is wider than the first gate 128-1 as the second gate 128-2 is formed on a larger feature. The gates 128, 130 may also have sidewall spacers formed thereon. The sidewall spacers may be used for a variety of purposes, including defining where source/drain regions are to be formed.

FIG. 1G illustrates a semiconductor device after the processes described above. Specifically, the n-type features 102 in the n-type region have anti-punch-through features 110 that are at substantially similar depths. Additionally, the p-type features 104 in the p-type region 103 have anti-punch-through features 118 that are at varying depths. The depths of the anti-punch-through features 118 are based on the size of features 104 in which they are formed. Specifically, larger features 104 have deeper anti-punch-through features. Conversely, smaller features 104 have shallower anti-punch-through features. The channel size of transistors formed in the features 104 generally corresponds with the size of the feature. Specifically, larger features have larger channels. Thus, devices with larger channels will have deeper anti-punch-through features and devices with smaller channels will have shallower anti-punch-through features. This helps prevent current leakage and reduces the short channel effect for devices with smaller channels.

Figure 2:
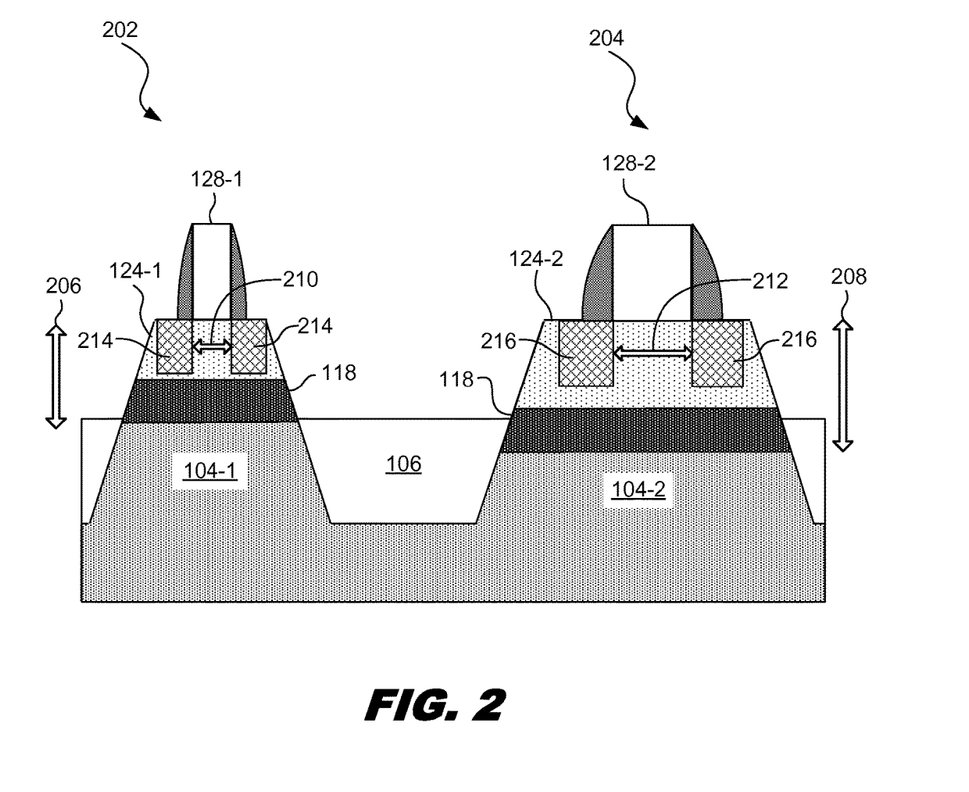
FIG. 2 is a diagram showing dimensions of devices with anti-punch-through features at varying depths, according to one example of principles described herein.

FIG. 2 is a diagram showing dimensions of p-type devices with anti-punch-through features at varying depths. According to the present example, the p-type region (e.g. 103, FIG. 1) includes a first transistor 202 and a second transistor 204. The first transistor 202 is formed on the first p-type feature 104-1, which is smaller than the second p-type feature 104-2. The first transistor 202 also includes source/drain regions 214, a gate 128-1, and a channel 210. The second transistor 204 also includes source/drain regions 216, a gate 128-2 and a channel 212.

The source/drain regions 214, 216 are formed adjacent to the respective gates 128. For p-type devices, the source/drain regions are doped with a p-type dopant. Thus, holes are used as the carrier for electric current. Depending on the signal applied to the gate 128, electric current will either be allowed to flow through the channel, or will be prevented from flowing through the channel. It is noted that the source/drain regions 214, 216 illustrated in FIG. 2 do not necessarily represent the actual shape of practically formed source/drain regions. Rather, the source/drain regions are shown for purposes of discussion.

The channel 210 of the first transistor 202 is smaller than the channel 212 of the second transistor 204. Accordingly, the anti-punch-through feature 118 of the first transistor 202 is shallower than the anti-punch-through feature of the second transistor 204. Specifically, there is a first distance 206 between the gate 128-1 and the bottom of the anti-punch-through feature of the first transistor 202. There is a second distance 208 between the gate 128-2 and the bottom of the anti-punch-through feature 118 of the second transistor 204. The first distance 206 is smaller than the second distance 208.

Because the first transistor 202 has a narrower channel 210, the first transistor 202 is more susceptible to short channel effects. As described above, the short channel effect can lead to undesirable performance as the voltage differential between the source and drain region may cause current to "punch through" the channel, even when the signal at the gate 128-1 is not intended to allow current to flow through the channel. The anti-punch-through feature 118, which has a higher n-type dopant concentration than that of both the underlying bulk silicon material and the semiconductor material 124 (e.g., silicon germanium) that forms the channel 210, 212, helps reduce the likelihood that current will punch through the channel when it is not intended for it to do so. Using principles described herein, transistors with shorter channels will have a shallower anti-punch-through feature, which will help suppress the short channel effects in such cases. Thus, devices using principles described herein can operate more efficiently.

Figure 3:
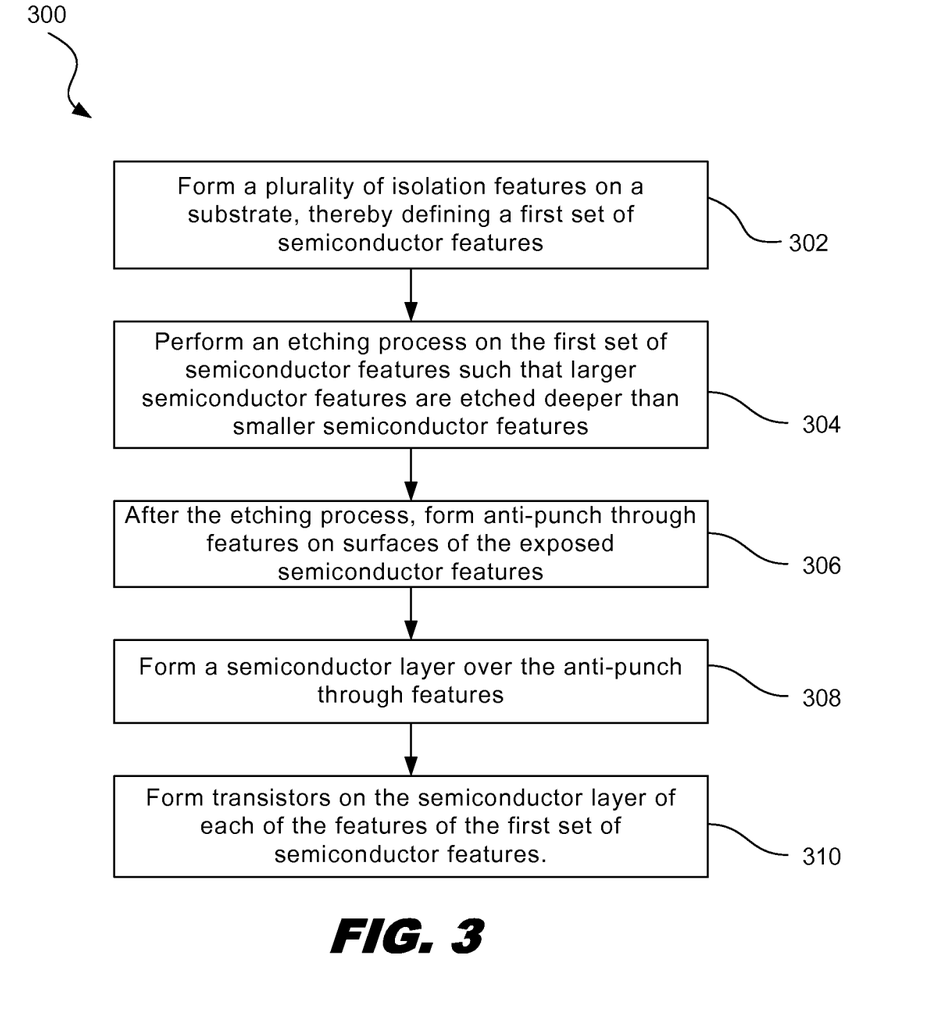
FIG. 3 is a flowchart showing an illustrative method for forming devices with anti-punch-through features at varying depths, according to one example of principles described herein.

FIG. 3 is a flowchart showing an illustrative method 300 for forming devices with anti-punch-through features at varying depths. The following method describes formation of features within the p-type region (e.g., 103, FIG. 1). According to the present example, the method 300 includes a step 302 for forming a plurality of isolation features on a substrate, thereby defining a number a first set of semiconductor features. This may be done by etching trenches where the isolation structures are to be formed. Then, the trenches can be filled with an isolation material, such as a dielectric material. A CMP process is then performed to planarize the surface of the substrate. Such isolation structures are often referred to as STI structures. The features around which the isolation structures are formed may be elongated fin-shaped structures. Such features are designed to become finFET structures after further processing.

According to the present example, the method 300 further includes a step 304 for performing an etching process on the semiconductor features such that larger semiconductor features are etched deeper than smaller semiconductor features. The etching process may be a dry etching process. Dry etching processes remove material by exposing the material to a bombardment of ions. This is done using plasma of reactive gases such as oxygen or chlorine with the addition of nitrogen or argon. The ions thus dislodge portions of the material from the exposed regions. Dry etching processes are generally anisotropic, which means that they etch primarily in one direction. Due to the loading effect, the larger features will be etched deeper than the smaller features.

According to the present example, the method 300 further includes a step 306 for forming anti-punch-through features on surface of the exposed semiconductor features. This is done after the etching process. Thus, due to the loading effect described above, the surfaces will have varying heights based on the size of the features. Forming the anti-punch-through features can be done through an ion implantation process. An ion implantation process involves use of an electrical field to accelerate ions to be impacted on a solid substrate. The accelerated ions will generally stay where they impact. The ion implantation process can be tuned, by tuning the electric field, so that the ions impact near the surface. The ion implantation process can be used to implant n-type dopants at a particular concentration that is appropriate for the anti-punch-through feature. Such a concentration is higher than the concentration of n-type dopants within the channel itself.

According to the present example, the method 300 further includes a step 308 for forming a semiconductor layer over the anti-punch-through features. The semiconductor layer is made of a semiconductor material that is suited for use as a channel material for a p-type transistor. In one example, the semiconductor layer is made of silicon germanium. The silicon germanium is also doped with n-type dopants with an appropriate concentration. The semiconductor layer may be formed using an epitaxial growth process. The semiconductor layer may be doped either in-situ or after formation of the semiconductor layer. In some examples, a CMP process may be performed to planarize the semiconductor layer so that the top surface of the semiconductor layer is co-planar with the top surface of the isolation structures.

According to the present example, the method 300 further includes a step 310 for forming transistors on the semiconductor layer of each of the semiconductor features of the first set of semiconductor features. The transistors may be finFET devices. Thus, the isolation structures may be etched so that the features protrude from the surface of the isolation structures to form fin-like features. Gates may then be formed over the fin-like features. Source and drain regions can then be formed adjacent the gates.

Using principles described herein, transistors with shorter channels will generally have shallower anti-punch-through features. The shallower anti-punch-through features will help suppress the short channel effects for the transistors with shorter channels. Thus, integrated circuits utilizing such features can operate more efficiently. Additionally, the above described process can be performed at a lower cost than conventional formation processes of anti-punch-through features.

Figure 4:
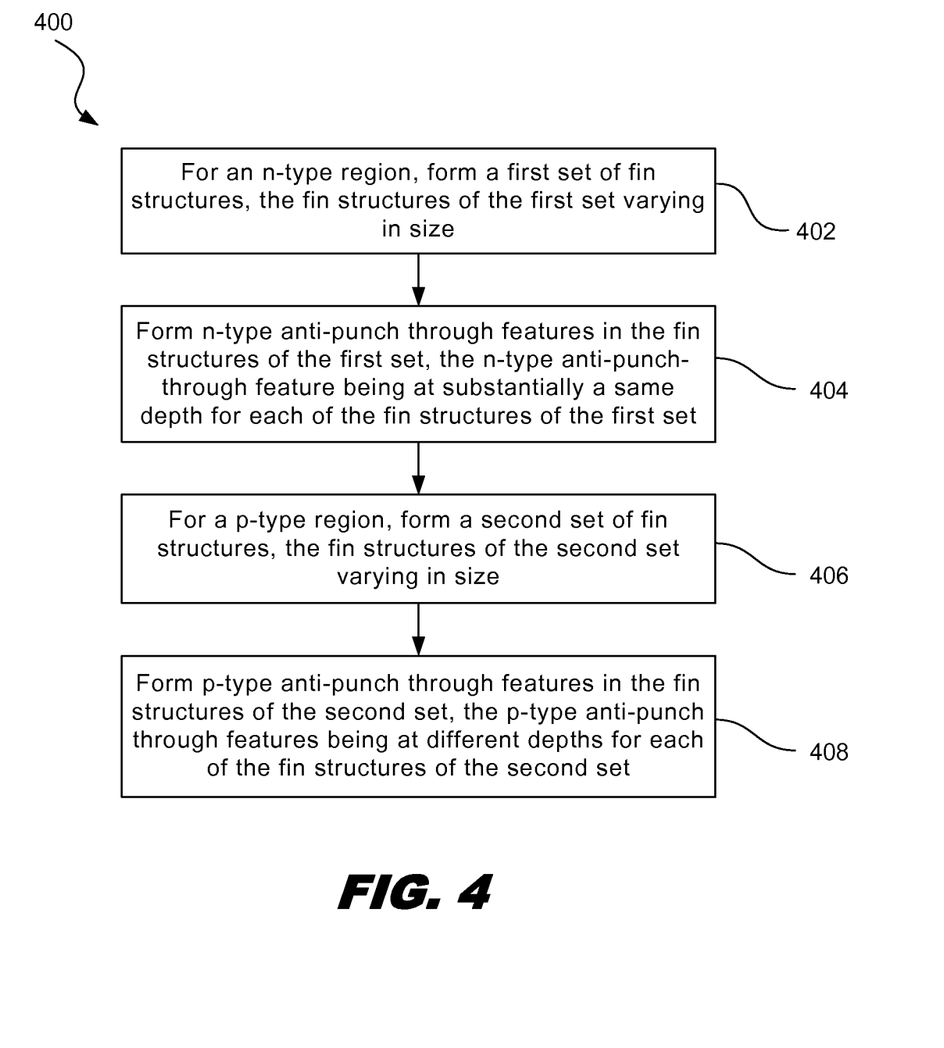
FIG. 4 is a flowchart showing an illustrative method 400 for forming n-type and p-type transistors on an integrated circuit, according to one example of principles described herein.

FIG. 4 is a flowchart showing an illustrative method 400 for forming n-type and p-type transistors on an integrated circuit. According to the present example, the method 400 includes a step 402 for, for an n-type region, forming a first set of fin structures, the fin structures of the first set varying in size. The fin structures may be formed according to the methods described above with respect to FIG. 1. Specifically, the fin structures may be formed such that they are surrounded by isolation structures, which may be STI structures.

According to the present example, the method 400 further includes a step 404 for forming n-type anti-punch-through features in the fin structures of the first set. The n-type anti-punch-through features are formed at substantially similar depths. Thus, even though the n-type features may vary in size, the anti-punch-through features are at substantially similar depths for each of the n-type features. The anti-punch-through features are also formed below the surface of the features such that there is room above the anti-punch-through features for a channel of a transistor.

The anti-punch though layers for the n-type features are formed using ion implantation. As described above, the ion implantation process is tuned such that the anti-punch-through features are formed below the surface. The anti-punch-through features of the n-type region comprise a p-type dopant. The anti-punch-through feature has a higher concentration of p-type dopants than the semiconductor material above the anti-punch-through features.

According to the present example, the method 400 includes a step 406 for, for a p-type region, forming a second set of fin structures, the fin structures of the second set varying in size. The fin structures may be formed according to the methods described above with respect to FIG. 1. Specifically, the fin structures may be formed such that they are surrounded by isolation structures, which may be STI structures.

According to the present example, the method 400 further includes a step 408 for forming p-type anti-punch-through features in the fin structures of the second set. The p-type anti-punch-through features are formed at varying depths. The varying depth is based on the respective size of the features in which the anti-punch-through features are formed. This can be done because the p-type features are etched before implanting the anti-punch-through features. Due to the loading effect, larger features are etched deeper. The ion implantation process that forms the anti-punch-through features is tuned so that the anti-punch-through features are formed at the surface, which varies based on feature size. Then, the channel material is epitaxially grown above the anti-punch-through features. The anti-punch-through features of the p-type region comprise an n-type dopant. The anti-punch-through features have a higher concentration of n-type dopants than the semiconductor material above the anti-punch-through features.

According to one example, a method of fabricating a semiconductor device includes forming a plurality of isolation features on a semiconductor substrate, thereby defining a first set of semiconductor features, performing an etching process on the first set of semiconductor features such that larger semiconductor features are etched deeper than smaller semiconductor features, after the etching process, forming anti-punch-through features on surfaces of the exposed features of the first set of semiconductor features, forming a semiconductor layer over the anti-punch-through features, and forming transistors on the semiconductor layer of each of the features of the first set of semiconductor features According to one example, a method includes, for an n-type region, forming a first set of fin structures, the fin structures of the first set varying in size, forming n-type anti-punch-through features in the fin structures of the first set, the n-type anti-punch-through feature being at substantially a same depth for each of the fin structures of the first set. The method further includes, for a p-type region, forming a second set of fin structures, the fin structures of the second set varying in size, and forming p-type anti-punch-through features in the fin structures of the second set, the p-type anti-punch-through features being at different depths for each of the fin structures of the second set.

According to one example, a semiconductor device includes a p-type region comprising a first set of fin structures, the fin structures of the first set varying in size, the fin structures of the first set comprising anti-punch-through features at varying depths. The p-type region further includes a plurality of p-type transistors formed on the fin structures of the first set, the p-type transistors having varying channel dimensions. The varying depths are based on the varying channel dimensions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   forming a plurality of isolation features on a semiconductor substrate, thereby defining a first set of semiconductor features;

performing an etching process on the first set of semiconductor features such that larger semiconductor features are etched deeper than smaller semiconductor features;
after the etching process, epitaxially forming anti-punch-through features on surfaces of the exposed features of the first set of semiconductor features;
forming a semiconductor layer over the anti-punch-through features;
removing a portion of the isolation features to expose at least a portion of the anti-punch-through features; and
forming transistors on the semiconductor layer of each of the features of the first set of semiconductor features.

2. The method of claim 1, wherein the anti-punch-through features comprise a higher doping concentration than the semiconductor layer.

3. The method of claim 1, wherein forming the semiconductor layer comprises performing an epitaxial growth process to for the semiconductor layer.

4. The method of claim 1, wherein the semiconductor layer comprises silicon germanium at a ratio of silicon to germanium within a range of about 1:0.1-0.9.

5. The method of claim 1, wherein the semiconductor layer is doped with a p-type dopant.

6. The method of claim 1, further comprising:
forming a second set of semiconductor features, the second set of features being separated by isolation features; and
forming anti-punch-through features below a top surface of the features of the second set of semiconductor features, each of the anti-punch-through features of the second set of semiconductor features being at substantially equal depths.

7. The method of claim 6, wherein forming the anti-punch-through features of the second set of semiconductor features comprises one of: performing an implanting process, performing a diffusion process, and performing an epitaxial growth process.

8. The method of claim 1, further comprising, performing an annealing process after forming the anti-punch-through features.

9. The method of claim 1, wherein the anti-punch-through features comprise a p-type dopant.

10. The method of claim 1, wherein the anti-punch-through features comprise a doping concentration within a range of $1\times10^{17}/cm^3$-$1\times10^{18}/cm^3$ and the semiconductor layer comprises a doping concentration within a range of $1\times10^{15}/cm^3$-$1\times10^{16}/cm^3$.

11. A method comprising:
for an n-type region, forming a first set of fin structures, the fin structures of the first set varying in size;
forming n-type anti-punch-through features in the fin structures of the first set, the n-type anti-punch-through feature being at substantially a same depth for each of the fin structures of the first set;
for a p-type region, forming a second set of fin structures, the fin structures of the second set varying in size; and
after forming the second set of fin structures, epitaxially forming p-type anti-punch-through features in the fin structures of the second set, the p-type anti-punch-through features being at different depths for each of the fin structures of the second set;
forming isolation features between the second set of fin structures, a top surface of the isolation features being below at least a portion of the p-type anti-punch-through features.

12. The method of claim 11, wherein forming the n-type anti-punch-through features comprises performing an ion implantation process to introduce dopants below a surface of the first set of fin structure.

13. The method of claim 11, wherein forming the p-type anti-punch-through features comprises performing an ion implantation process at a surface of the second set of fin structures.

14. The method of claim 11, further comprising, forming a silicon germanium layer on top of the p-type anti-punch-through features.

15. The method of claim 11, wherein different depths of the p-type anti-punch-through features are based on a size of corresponding fin structures.

16. The method of claim 15, wherein larger fin structures have deeper anti-punch-through features.

17. The method of claim 11, further comprising:
forming n-type transistors on the first set of fin structures; and
forming p-type transistors on the second set of fin structures.

18. A semiconductor device comprising:
a p-type region comprising:
a first set of fin structures, the fin structures of the first set varying in size, the fin structures of the first set each comprising:
a bottommost portion;
a channel portion disposed above the bottommost portion and having an n-type dopant at a first concentration; and
an epitaxially grown anti-punch-through feature extending from the bottommost portion to the channel portion and having an n-type dopant throughout at a second concentration greater than the first concentration, wherein the anti-punch-through feature of a first fin structure of the first set extends to a different depth than the anti-punch-through feature of a second fin structure of the first set;
a plurality of p-type transistors formed on the fin structures of the first set, the p-type transistors having varying dimensions; and
a number of isolation features positioned such that a top surface of the isolation features is below a first portion of each of the anti-punch-through features and above a second portion of each of the anti-punch-through features.

19. The semiconductor device of claim 18, further comprising:
an n-type region comprising:
a second set of fin structures, the fin structures of the second set varying in size, the fin structures of the second set comprising anti-punch-through features at substantially similar depths; and
a plurality of n-type transistors formed on the fin structures of the second set, the n-type transistors having varying channel lengths.

20. The semiconductor device of claim 19, wherein a channel material for the n-type transistors comprises silicon and a channel material for the p-type devices comprises silicon germanium.

* * * * *